United States Patent [19]

Koo et al.

[11] Patent Number: 5,498,871
[45] Date of Patent: Mar. 12, 1996

[54] METHOD FOR ANALYZING THE DEFECTIVENESS OF SEMICONDUCTOR DEVICE

[75] Inventors: Jeong H. Koo; Chung T. Kim; Song K. Ju, all of Ichonkun, Rep. of Korea

[73] Assignee: Hyundai Electronics Industries Co., Ltd., Rep. of Korea

[21] Appl. No.: 175,778

[22] Filed: Dec. 28, 1993

[30] Foreign Application Priority Data

Dec. 30, 1992 [KR] Rep. of Korea ............... 1992-26869

[51] Int. Cl.$^6$ ............................. G01N 23/225
[52] U.S. Cl. ............................. 250/307; 250/310
[58] Field of Search ............................. 250/307, 306, 250/310; 156/643, 657, 662; 437/228

[56] References Cited

U.S. PATENT DOCUMENTS

| | | | |
|---|---|---|---|
| 4,789,426 | 12/1988 | Pipkin | 156/643 |
| 4,803,358 | 2/1989 | Kato et al. | 250/307 |
| 5,147,499 | 9/1992 | Szwejkowski et al. | 156/643 |
| 5,214,283 | 5/1993 | Le | 250/307 |
| 5,296,093 | 3/1994 | Szwejkowski et al. | 156/643 |

*Primary Examiner*—Jack I. Berman
*Attorney, Agent, or Firm*—Merchant, Gould, Smith, Edell, Welter & Schmidt

[57] ABSTRACT

The method for analyzing defects in a semiconductor device comprises the steps of: removing upper layers covering an analysis objective portion in a testing sample; etching neighboring layers surrounding the analysis objective portion using materials having an appropriate etching selection ratio, to expose the analysis objective portion; observing the sample relating to the analysis objective portion with a scanning electron microscope, the sample being set on a holder of the scanning electro microscope and being changed in tilt and rotational angle, whereby the sample can be examined in three dimensions. The method takes advantage of chemical properties, so that a defective part of a semiconductor can be analyzed rapidly and economically. In addition, the method overcomes a problem which can not be solved with the conventional analyzing method, such that observation can be accurately performed in any desired direction. As a results, the method is superior in accuracy and can be applied to a device on the basis of such advantage, so there is brought about an effect that three dimensional analysis is possible in observing the sample in spite of different conditions.

5 Claims, 2 Drawing Sheets

METHOD FOR ANALYZING THE DEFECTIVENESS OF SEMICONDUCTOR DEVICE

BACKGROUND OF THE INVENTION

1. Field of the Invention

The present invention relates, in general, to a method for the analysis of defects in a semiconductor device and, more particularly, to a method for examining a semiconductor device accurately, rapidly and in three dimensions.

2. Description of the Prior Art

When a semiconductor device is made highly integrated, the layer thickness and the line width in the semiconductor device become are reduced. This reduction generates misalignments among polysilicon layers, causing shorts in the polysilicon layers.

Conventionally, to examine the defects of a device caused by the misalignment generated in the polysilicon layers, the layers formed in the device are removed one by one with a dry or a wet etch process and the state of each layer is observed. Alternatively, there has been employed a lapping method, in which, using a bit map, a region including the portion at which a defect is believed to be generated is cut with a diamond pencil and then, while the region is abraded finely,,the state of the region abraded is observed to find the defective portion.

The conventional methods may be useful in observing a short generated in the same layer. However, since, in a structure in which layers overlap with one another in three dimensions, an upper layer spaced out by a minute distance screens lower layers, and the state between the lower layers can not be, in two dimensions, observed with the conventional methods. Accordingly, after removing the upper layer, the trace of contact left on the lower layer and the dimension of the lower layer are observed, so as to indirectly analyze the state of a defect.

Particularly, when the lapping method is used, the preparatory procedure for the analysis is troublesome. In addition, since the physical strength required in the lapping method may damage the pattern formed in the device, it is inferior in an accuracy aspect.

SUMMARY OF THE INVENTION

Therefore, an object of the present invention is to solve the aforementioned problems encountered in the prior arts and to provide a method for analyzing the defects of a semiconductor device, which method is an improvement in accuracy and speed.

In accordance with the present invention, the above object can be accomplished by providing a method for analyzing the defects in a semiconductor device, comprising the steps of: removing upper layers covering an analysis objective portion in a test sample; etching neighboring layers surrounding said analysis objective portion by means of etching according to a selection ratio, to expose said analysis objective portion; observing said sample relating to said analysis objective portion with a scanning electron microscope, said sample being set on a holder of said scanning electron microscope and being changed in tilt is rotational angle, whereby said sample is examined in three dimensions.

BRIEF DESCRIPTION OF THE DRAWINGS

Other objects and aspects of the Invention will become apparent from the following description of embodiments with reference to the accompanying drawings in which.

DETAILED DESCRIPTION OF THE PRESENT INVENTION

Figure 1A:
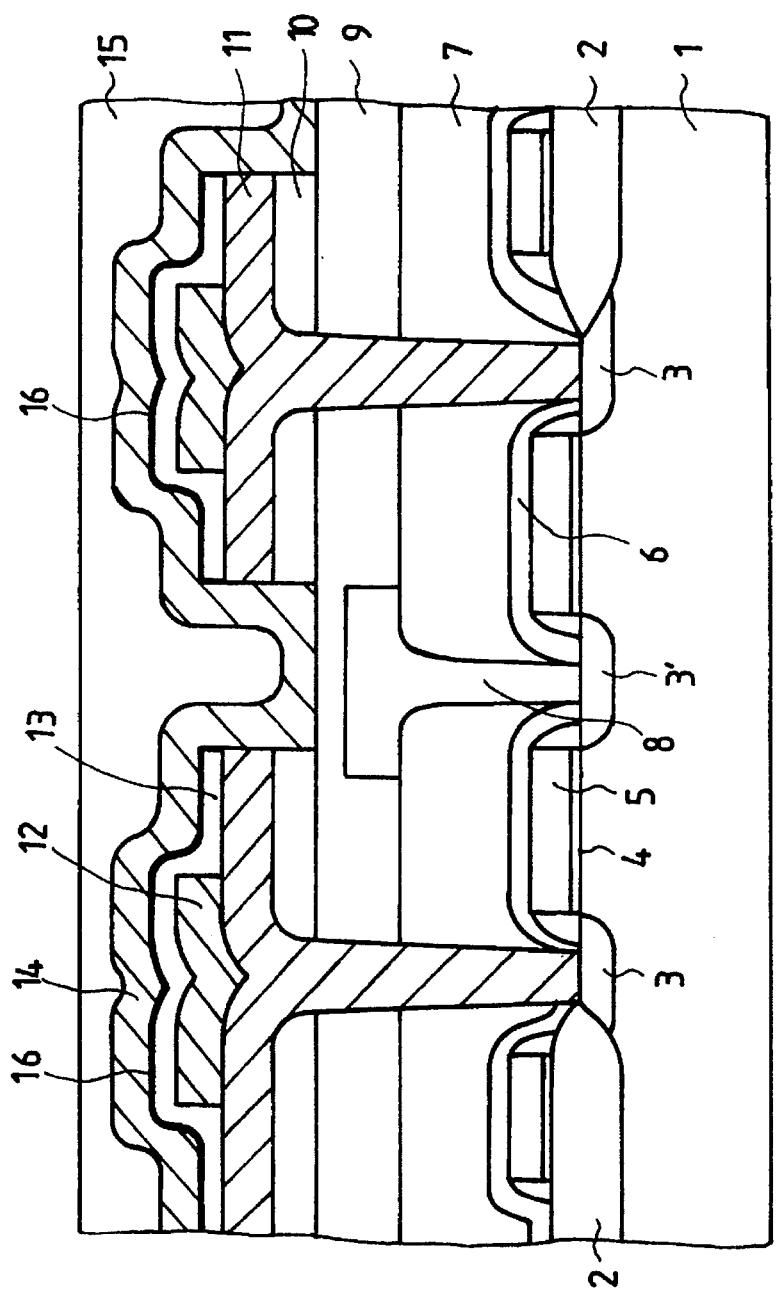
FIG. 1A is a schematic cross sectional view showing a DRAM structure as an example.

Hereinafter, the preferred embodiment of the present invention will be, in detail, described with reference to the accompanying drawings, wherein a semiconductor substrate is represented as reference numeral 1, a field oxide film 2, a source 3, a drain 3', a gate oxide film 4, a gate 5, oxide films 6, 7, 9, 10 and 15, a bit line consisting of polysilicon film 8, and polysilicon films 11, 12, 13, and 14 for a capacitor as a part of the semiconductor.

In contrast with the conventional analysis methods which use a deprocessing or lapping process to observe the state of the semiconductor, in two dimensions, on a plan view or a cross sectional view, the method according to the present invention takes advantage of chemical selectivity, so as to extend the region to be analyzed into three dimensions.

Referring to FIG. 1A, there is a cross sectional view showing a DRAM sample to be analyzed. As illustrated in this drawing, the defective part of the DRAM is mainly generated at contact regions. Thus, a contact between a source 3 and a charge storage electrode is selected as an objective region.

Since the upper structure of the polysilicon film 11, constituting a part of the charge storage electrode comprising polysilicon films 11, 12, 13, as shown in FIG. 1A, screens the contact region formed below, predetermined portions of the charge storage electrode formed above the contact region are primarily removed except for the regions coming into contact with the source 3. That is, using a dry etching process, an attack is made on the predetermined upper portions to remove them, leaving only the polysilicon film 11 contacting the source 3 and the bit line 8 connected with the drain 3'.

Figure 1B:
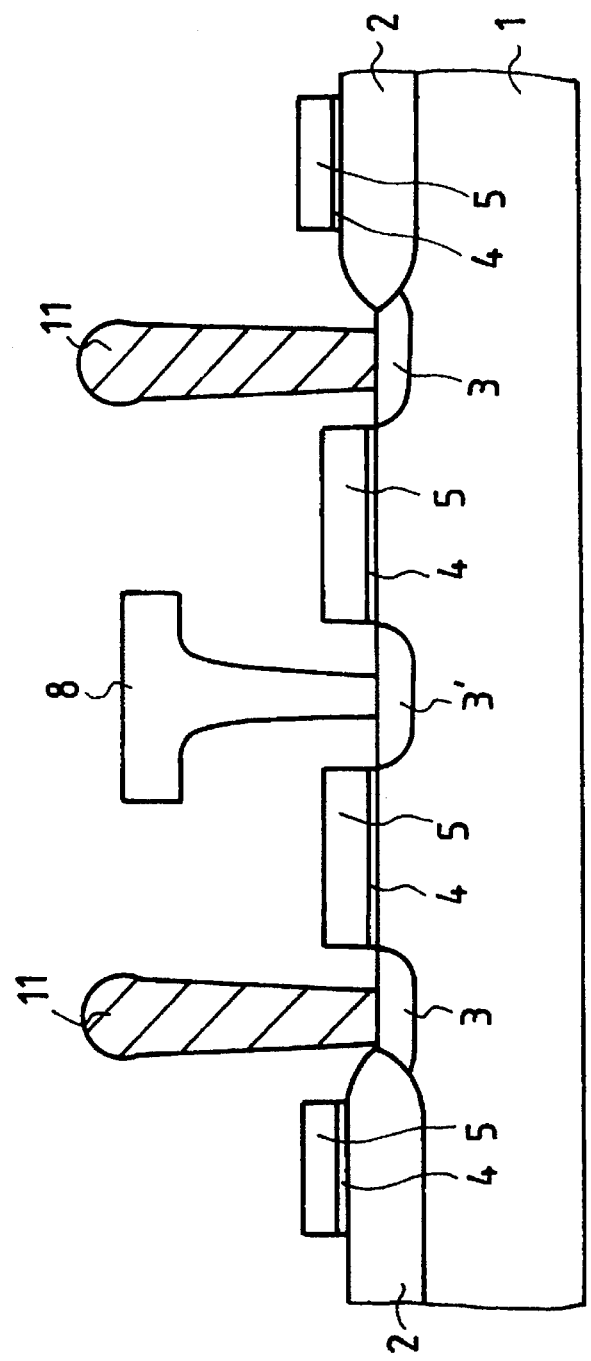
FIG. 1B is a schematic cross sectional view showing a test sample of FIG. 1A, according to the present invention.

Following this, a dilute HF solution, which has a high etching selection ratio of oxide film: to polysilicon film, is used to remove the oxide films but having the contact regions and the framework of the polysilicon film 11. The result is shown in FIG. 1B.

The HF solution does not directly react with the polysilicon film but removes the oxide films, as shown in the following reaction formula I.

On the other hand, the polysilicon film reacts with the etching solution in the presence of $HNO_3$ and is removed, as shown in the following reaction formula II. Therefore, HF solution exhibits a high etching selection ratio of oxide film to polysilicon film in absence of HF.

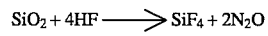

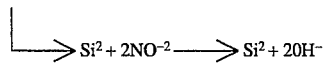

Therefore, if the oxide films are removed according to the principle described above, it is possible to observe the polysilicon film and the regions coming into contact with the bit line 8 in three dimensions.

With regard to the etching for polysilicon films, the polysilicon films of the upper layers are removed in an etching solution containing $CH_3COOH$, $NHO_3$ and HF, so as to observe the shorts generated among the polysilicon films. In this etching solution, the mole ratio of $CH_3COOH$, $NHO_3$ and $HF$ may be 20:4:1.

In the meanwhile, since a composite dielectric film 16 constituting the capacitor of semiconductor, such as oxide-nitride-oxide (hereinafter, "ONO"), is low in etching selection ratio, fine accuracy is not required in a dry etching process making an attack on the polysilicon film formed over the ONO film.

On the other hand, the polysilicon films 11, 12 and 13 formed below the dielectric film 16, that is, components of the charge storage electrode, are etched under the following dry etching conditions: Atmosphere: $CF_4$ (25 ml/min.)+$O_2$ (small amount); Radio frequency Power: 200 W; Temperature: to 30° C.; Etching Time: about 1 min.; and Degree of Vacuum: $3 \times 10^{-1}$ Torr. By the way, when carrying out a dry etching process using plasma, the degree of the attack applied to the charge node can not be quantified, so that there is required a technique that allows one to judge the degree and state of the attack, using a microscope.

In addition, when carrying out a selective wet etching process which takes advantage of the high etching selection power of HF solution, in which the etching selection ratio of oxide film to polysilicon film is on the order of 20:1, the etching time is about $8 \pm \alpha$ min. wherein $\alpha$ is the time varied in dependence with a result.

As described above, in the dilute HF solution showing the etching selection ratio of 20:1 for oxide film to polysilicon film, an etching reaction for oxide film rapidly proceeds whereas that for polysilicon film occurs little. At last, taking advantage of the difference of the etching ratio, the oxide film is removed, and through the remaining polysilicon film contact and the framework of the lower layers, the defective portion can be observed in three dimensions.

As explained hereinbefore, since the present invention takes advantage of chemical properties, a defective part of a semiconductor can be analyzed rapidly. Accordingly, the present invention is advantageous in an economical aspect.

What is better, the method according to the present invention overcomes a problem which can not be solved with the conventional analyzing method, such that the observation is accurately performed in any desired direction.

That is to say, the defective portion of the objective sample having undergone the etching processes can be examined by changing the tilt and the rotational angle of SEM in which the objective sample is set. Therefore, the analyzing method according to the present invention is superior in accuracy. In case the method according to the present invention is applied to the other type device on the basis of such advantage, there is brought about an effect such that three dimensional analysis is possible in observing the other type sample in spite of different conditions.

Although the preferred embodiment of the present invention has been disclosed for illustrative purposes, those skilled in the art will appreciate that various modifications, additions and substitutions are possible, without departing from the scope and spirit of the present invention as disclosed in the accompanying claims.

What is claimed is:

1. A method for analyzing defects in a semiconductor device at an analysis objective portion in a testing sample, said semiconductor device having layers of silicon oxide film and a layer of polysilicon film, said layer of polysilicon film being an upper layer covering said analysis objective portion, said layers of silicon oxide film including neighboring layers of oxide film surrounding said analysis objective portio, comprising the steps of:

removing said upper layer of polysilicon film covering said analysis objective portion in the testing sample;

etching said neighboring layers of oxide film surrounding said analysis objective portion to expose said analysis objective portion;

observing said sample relating to said analysis objective portion with a scanning electron microscope, said sample being set on a holder of said scanning electron microscope and being change in tilt and rotational angle, whereby during said observing step, said sample can be examined in three dimensions.

2. A method according to claim 1, wherein said analysis objective portion is a contact region in which a charge storage electrode contacts a source.

3. A method according to claim 1, wherein said oxide film surrounding said analysis objective portion is removed with a wet etching in a HF solution which has an etching selection ratio of 20:1 for oxide film to polysilicon film.

4. A method according to claim 1, wherein said upper layer forms a charge storage electrode and is etched under an atmosphere consisting of $CF_4$ and $O_2$, $CF_4$ being provided in a flow rate of about 25 ml/min.

5. A method according to claim 2, further comprising the step of determining the degree of etching of said charge storage electrode with said scanning electron microscope.

\* \* \* \* \*

UNITED STATES PATENT AND TRADEMARK OFFICE
CERTIFICATE OF CORRECTION

PATENT NO. : 5,498,871

DATED : March 12, 1996

INVENTOR(S) : Koo et al.

PAGE 1 of 2

It is certified that error appears in the above-identified patent and that said Letters Patent is hereby corrected as shown below:

On the title page: Item[54] and Column 1, lines 1-2,

"THE DEFECTIVENESS OF" should read --DEFECTS IN A--

[57], Abstract, line 10 "electro" should read --electron--

[57], Abstract, line 18 "results" should read --result--

Col. 1, line 15 delete "become" after the word "device"

Col. 1, line 65 "Invention" should read --invention--

Col. 2, line 1 "cross sectional" should read --cross-sectional--

Col. 2, line 3 "cross sectional" should read --cross-sectional--

Col. 2, line 19 "cross sectional" should read --cross-sectional--

Col. 2, line 22 "cross sectional" should read --cross-sectional--

Col. 2, line 41 delete ":" after the word "film"

Col. 2, line 42 "having" should read --leaving--

Col. 3, line 20 delete "," after the word "attack"

UNITED STATES PATENT AND TRADEMARK OFFICE
CERTIFICATE OF CORRECTION

PATENT NO. :   5,498,871

DATED      :   March 12, 1996

INVENTOR(S) :  Koo et al.

It is certified that error appears in the above-identified patent and that said Letters Patent is hereby corrected as shown below:

Col. 4, line 20 "portio" should read --portion--

Col. 4, line 29 "change" should read --changed--

Col. 4, line 36 "film" should read --films--

Col. 4, line 37 "is" should read --are--

Signed and Sealed this

Fourth Day of February, 1997

Attest:

BRUCE LEHMAN

Attesting Officer        Commissioner of Patents and Trademarks